(12) United States Patent
Hoepfner et al.

(10) Patent No.: US 7,223,939 B2
(45) Date of Patent: May 29, 2007

(54) ELECTRICAL CONNECTOR FOR A WINDOW PANE OF A VEHICLE

(75) Inventors: Timothy P. Hoepfner, Grand Lodge, MI (US); Mark S. Ackerman, Brooklyn, MI (US); Makoto Sato, Ann Arbor, MI (US)

(73) Assignee: AGC Automotive Americas, R & D, Inc., Ypsilanti, MI (US)

( * ) Notice: Subject to any disclaimer, the term of this patent is extended or adjusted under 35 U.S.C. 154(b) by 0 days.

(21) Appl. No.: 10/988,350

(22) Filed: Nov. 12, 2004

(65) Prior Publication Data

US 2006/0102610 A1  May 18, 2006

(51) Int. Cl.
*B60L 1/02* (2006.01)
(52) U.S. Cl. ..................... 219/203; 219/553
(58) Field of Classification Search ..... None
See application file for complete search history.

(56) References Cited

U.S. PATENT DOCUMENTS

| | | | |
|---|---|---|---|
| 2,644,066 A | 6/1953 | Glynn | |
| 3,324,543 A | 6/1967 | McVey et al. | 29/472.9 |
| 3,657,802 A | 4/1972 | Delmas | 29/472.9 |
| 3,736,649 A | 6/1973 | Bristow | 29/473.1 |
| 3,795,041 A | 3/1974 | Hennicke et al. | 29/472.9 |
| 3,926,357 A | 12/1975 | Matrisian | 228/110 |
| 4,024,613 A | 5/1977 | Martel et al. | 29/25.13 |
| 4,546,409 A | 10/1985 | Yoshino et al. | 361/387 |
| 4,589,584 A | 5/1986 | Christiansen et al. | 228/110 |
| 4,707,591 A | 11/1987 | Sprenger | 219/541 |
| 4,763,828 A | 8/1988 | Fukaya et al. | 228/124 |
| 4,925,607 A | 5/1990 | Kyle | 264/60 |
| 4,935,583 A | 6/1990 | Kyle | 174/152 |
| 5,013,612 A | 5/1991 | Hunt et al. | 428/552 |
| 5,058,800 A | 10/1991 | Yoshizawa et al. | 228/180.2 |
| 5,134,248 A | 7/1992 | Kiec et al. | 174/84 R |
| 5,198,056 A | 3/1993 | Stöckli et al. | 156/73.1 |
| 5,270,517 A | 12/1993 | Finley | 219/203 |
| 5,288,006 A | 2/1994 | Otsuka et al. | 228/111 |

(Continued)

FOREIGN PATENT DOCUMENTS

| | | |
|---|---|---|
| DE | 3604437 | 8/1987 |
| DE | 19536131 | 1/1997 |
| EP | 1657964 A1 | 5/2006 |
| JP | 62172676 | 7/1987 |
| JP | 2002134254 A | 5/2002 |
| WO | WO 04/068643 A1 | 8/2004 |

OTHER PUBLICATIONS http://en.wikipedia.org/wiki/Thermal_expansion_coefficient.*

(Continued)

*Primary Examiner*—Thor Campbell
(74) *Attorney, Agent, or Firm*—Howard & Howard Attorneys, P.C.

(57) ABSTRACT

A window pane has a substrate formed from glass and includes an electrical device. The electrical device includes an electrical conductor. An electrical connector is operatively connected to and in electrical communication with the conductor for transferring electrical energy to the conductor. The substrate has a first coefficient of expansion and the connector has a second coefficient of thermal expansion. A difference between the first and second coefficients of thermal expansion is equal to or less than $5 \times 10^{-6}/°$ C. for minimizing mechanical stress between the connector and the substrate due to thermal expansion of the connector and the substrate resulting from changes in temperature.

22 Claims, 6 Drawing Sheets

U.S. PATENT DOCUMENTS

| | | | | |
|---|---|---|---|---|
| 5,354,392 | A | 10/1994 | Santo et al. | 156/73.1 |
| 5,454,506 | A | 10/1995 | Jordhamo et al. | 228/110.1 |
| 5,735,446 | A | 4/1998 | White et al. | 228/114.5 |
| 5,738,270 | A | 4/1998 | Malmgren | 228/193 |
| 5,738,554 | A | 4/1998 | Borger et al. | 439/874 |
| 5,798,031 | A | 8/1998 | Charlton et al. | 204/403 |
| 5,845,836 | A | 12/1998 | White et al. | 228/56.3 |
| 5,857,259 | A | 1/1999 | Johnston | 29/858 |
| 5,867,128 | A | 2/1999 | Sauer | 343/713 |
| 5,897,964 | A | 4/1999 | White et al. | 428/630 |
| 6,039,238 | A | 3/2000 | Panaghe et al. | 228/110.1 |
| 6,103,034 | A | 8/2000 | Fujiwara et al. | 153/73.1 |
| 6,103,998 | A | 8/2000 | Kuno et al. | 219/203 |
| 6,103,999 | A | 8/2000 | Nishio et al. | 219/203 |
| 6,123,588 | A | 9/2000 | Johnston | 439/876 |
| 6,135,829 | A | 10/2000 | Johnston | 439/874 |
| 6,217,373 | B1 | 4/2001 | Johnston | 439/499 |
| 6,307,515 | B1 | 10/2001 | Sauer et al. | 343/713 |
| 6,396,026 | B2 | 5/2002 | Gillner et al. | 219/203 |
| 6,528,769 | B2 | 3/2003 | Schnabel et al. | 219/446.1 |
| 6,534,720 | B2 | 3/2003 | Von Alpen et al. | 174/149 |
| 6,834,969 | B2 * | 12/2004 | Bade et al. | 359/507 |
| 2001/0030185 | A1 | 10/2001 | Schnabel et al. | 219/446.1 |
| 2002/0111081 | A1 | 8/2002 | Manuel | |
| 2003/0121906 | A1 | 7/2003 | Abbott et al. | 219/543 |
| 2003/0155467 | A1 | 8/2003 | Petrenko | 244/134 |

OTHER PUBLICATIONS http://en.wikipedia.org/wiki/Soda-Lime_Glass.*

Author Unknown, "Welding of Titanium Alloys", www.key-to-metals.com printed Jun. 23, 2004, pp. 1-4, Copyright 2000-2003 INI International. Distribution for STEP-COMMERCE AG, Spiegelhofstrasse 26, Zurich Switzerland.

Publication entitled "*Future of Heatable Automotive Glazing Conductive Pastes*", reprinted from Screenprinting & Decorating—Stars of the 'Silver' Screen Automotive Glass; from International Glass Review, published in 2001—Issue 2, pp. 117-122, by Artur Bechtloff, Product Manager Conductive Pastes, dmc2, Glass Systems Division, of Gutleutstrasse 215, D-60039 Frankfurt, Germany.

Publication entitled "*Tarnishing-resistant Lead-free Silver Paste for Automotive Backlights*", www.glassfiles.com reprinted from Glass Processing Days, p. 18-21, Jun. 2001, by Roland Billing and Detlef Rehorek of Johnson Matthey Glass.

U.S. Appl. No. 10/987,469, filed Nov. 12, 2004.

* cited by examiner

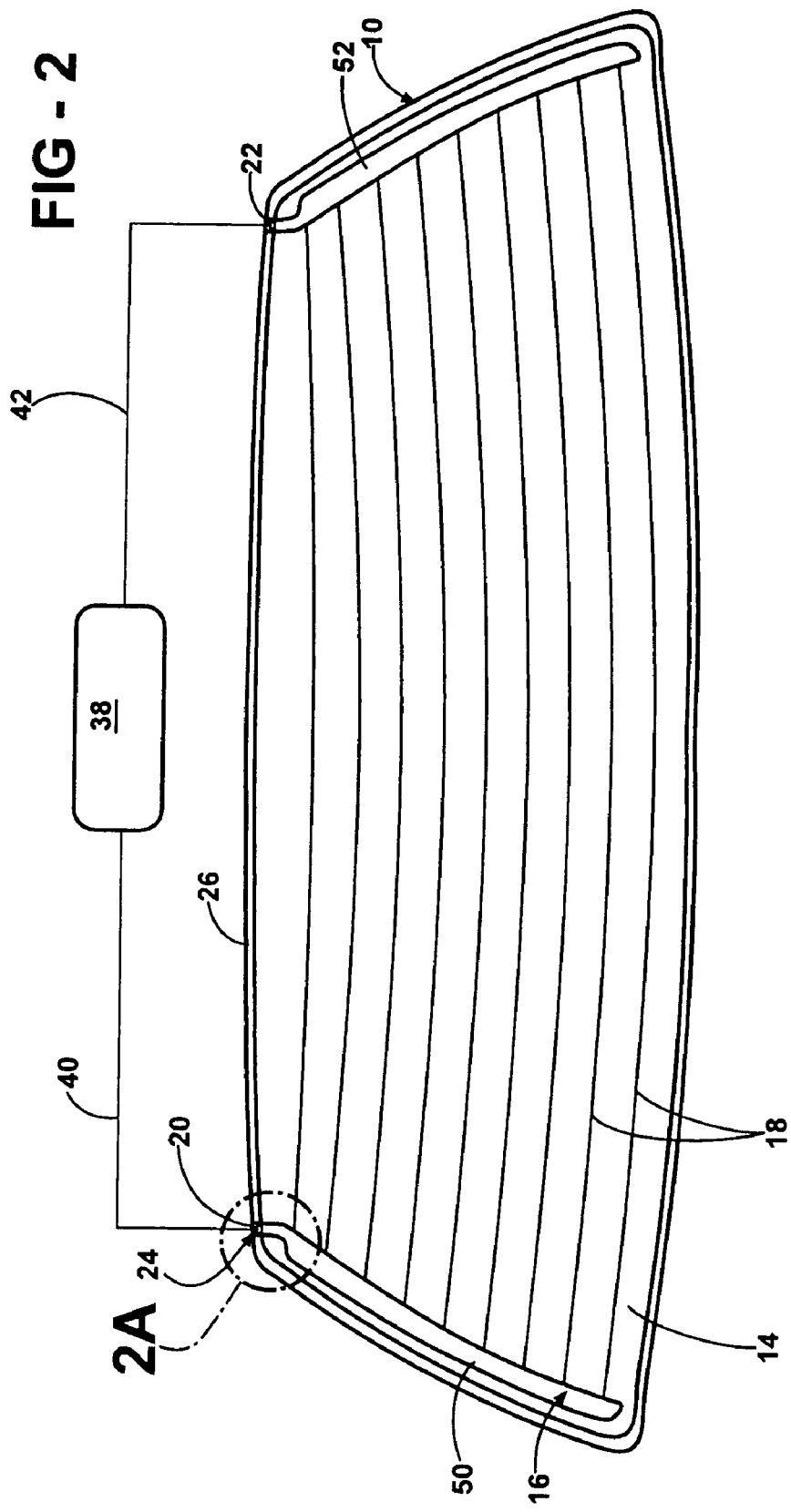

ELECTRICAL CONNECTOR FOR A WINDOW PANE OF A VEHICLE

BACKGROUND OF THE INVENTION

1. Field of the Invention

The subject invention generally relates to an electrical connector for a window pane of a vehicle. More specifically, the subject invention relates to an electrical connector having a unique composition that transfers electrical energy to an electrical conductor of the vehicle, such as a defogger, defroster, antenna, etc.

2. Description of the Related Art

Electrical connectors are known in the art for use in vehicles. The connectors are metallurgically connected to and in electrical communication with an electrical conductor for transferring electrical energy to the conductor. More specifically, the conductors, which generally include silver, are operatively connected to a substrate that is formed from glass, such as a backlite or windshield of a vehicle. The conductors are commonly visible on window panes of vehicles and typically extend horizontally across the window panes. The conductors are generally defoggers, defrosters, and antennas.

Traditionally, the connectors include lead because lead is a deformable metal and minimizes mechanical stress between the connector and the substrate due to thermal expansion of the connector and the substrate resulting from changes in temperature. More specifically, differences in coefficients of thermal expansion cause the mechanical stress. Such thermal expansion may result in cracking or other damage to the substrate. Furthermore, the lead resists delamination from the conductor. However, it is known that lead may be considered an environmental contaminant. As such, there is a motivation in many industries, including the automotive industry, to move away from all uses of lead in vehicles.

Conventional materials have been proposed for replacing the lead in the connectors; however, such materials, such as copper, tend to delaminate from the conductor. Other conventional materials are not immune to mechanical stress between the connector and the substrate due to thermal expansion of the connector and the substrate resulting from changes in temperature, which tends to crack or otherwise damage the substrate. Because these other conventional materials are insufficient, there has been little movement in the automotive industry away from connectors including lead.

Although there has been development of various conductors for use in the window panes of vehicles, such developments have little applicability to electrical connector technology. For example, U.S. Pat. No. 6,396,026 discloses a laminated pane for a vehicle including an electrical conductor disposed between two glass panes. The electrical conductor includes a layered structure that may include titanium to provide rigidity to the electrical conductor. The electrical conductor is positioned in an interlayer between the panes. In this position, the electrical conductor is spaced from the glass panes. The titanium-containing conductor in the '026 patent cannot effectively function as a connector that connects a power supply to a conductor that is operatively connected to one of the glass panes. More specifically, the titanium is disclosed as a core of the conductor, with an outer surface including a more conductive metal such as copper. The titanium core with the outer surface including copper is ineffective for use as an electrical connector due to the presence of the copper because the copper would delaminate from the conductor due to mechanical stress between the copper and the glass pane due to thermal expansion of the copper and the glass pane resulting from changes in temperature.

Thus, there remains a need to replace connectors which include lead with a more environmentally-friendly alternative that can still reduce the mechanical stress between the connector and the substrate due to thermal expansion of the connector and the substrate resulting from changes in temperature, and further resist delamination from the conductor.

SUMMARY OF THE INVENTION AND ADVANTAGES

The subject invention provides an electrical device for a window pane. The window pane includes a substrate. The subject invention also provides the window pane including the electrical device and a vehicle including the window pane. The electrical device includes an electrical conductor and an electrical connector. The connector is operatively connected to and in electrical communication with the conductor for transferring electrical energy to the conductor. The substrate has a first coefficient of thermal expansion and the connector has a second coefficient of thermal expansion. A difference between the first and second coefficients of thermal expansion is equal to or less than $5 \times 10^{-6}/° $ C. for minimizing mechanical stress between the connector and the substrate due to thermal expansion of the connector and the substrate resulting from changes in temperature. As a result, the connector resists delamination from the conductor.

BRIEF DESCRIPTION OF THE DRAWINGS

Other advantages of the present invention will be readily appreciated as the same becomes better understood by reference to the following detailed description when considered in connection with the accompanying drawings wherein:

FIG. 2 is a view of the window pane of FIG. 1 with a power supply schematically illustrated;

DETAILED DESCRIPTION OF THE PREFERRED EMBODIMENT

Figure 1:
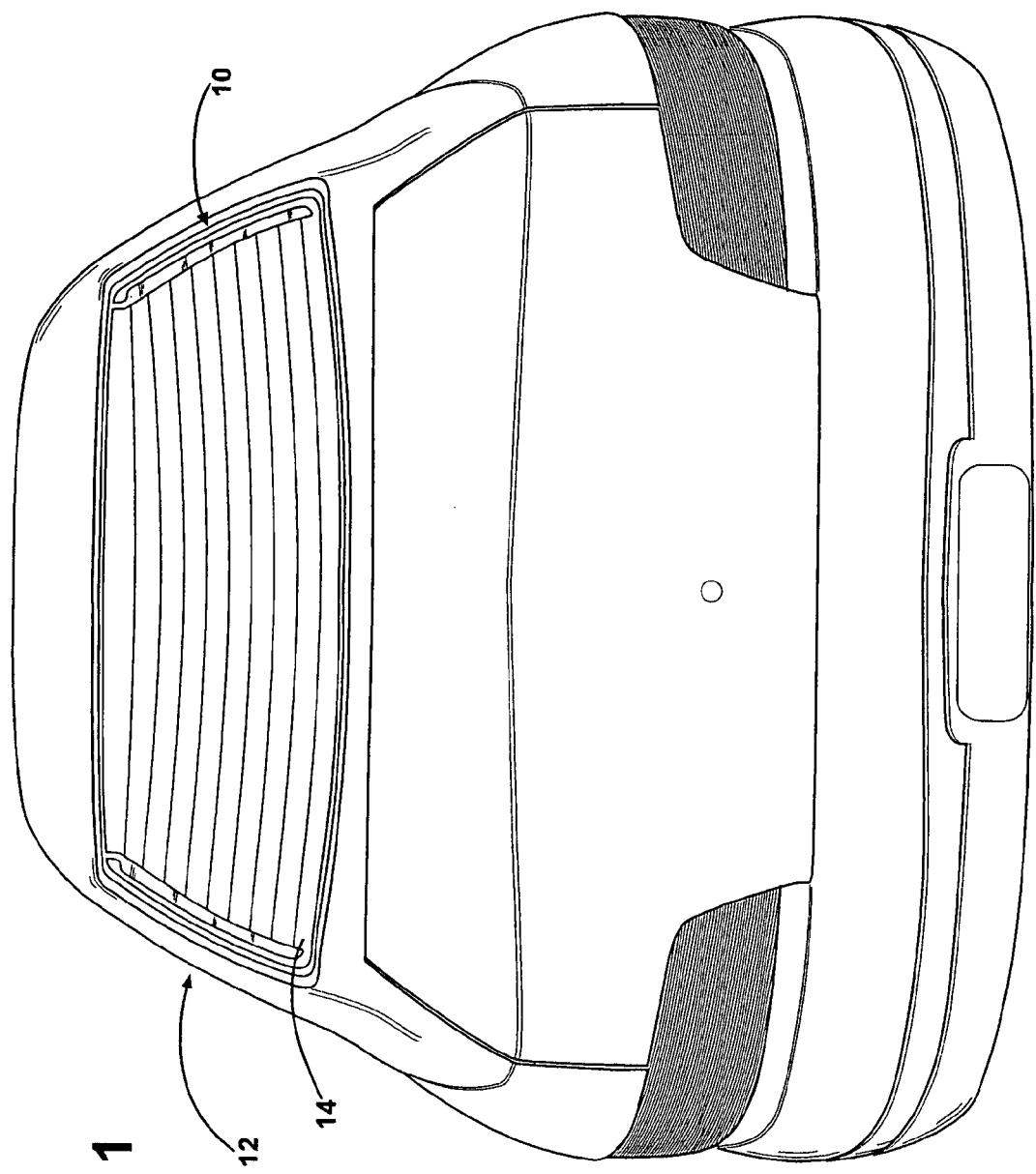
FIG. 1 is a perspective view of a vehicle including a rear window pane having an electrical device.

Referring to the Figures, wherein like numerals indicate like or corresponding parts throughout the several views, a window pane is generally shown at 10 on a vehicle 12. The window pane 10 includes a substrate 14 that has a first coefficient of thermal expansion. Preferably, the substrate 14 is formed from glass; however, the substrate 14 may be formed from other materials such as ceramic. More preferably, the glass is further defined as an automotive glass. In a most preferred embodiment, the automotive glass is further defined as soda-lime-silica glass, which is well known for use in window panes 10 of vehicles 12. However, it is to be appreciated that the glass may be any type of glass composition that is known in the art.

An electrical conductor 16 is applied across a region of the substrate 14. Preferably, the conductor 16 includes silver; however, it is to be appreciated that other conductive metals may also be suitable for the conductor 16. The electrical conductor 16 is visible on the pane 10 and typically includes lines 18 that extend horizontally across the pane 10. The conductor 16 is preferably a defogger, defroster, antenna, or a combination thereof. However, the conductor 16 may serve any function known in the art for such conductors 16.

Figure 2A:
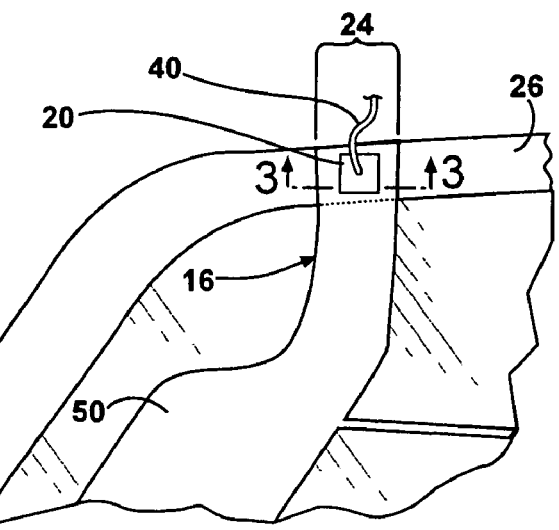
FIG. 2a is a partial view a portion of the window pane of FIG. 2 including an electrical connector operatively connected to an electrical conductor.

Referring to FIGS. 2 and 2a, an electrical connector 20 is operatively connected to and in electrical communication with the conductor 16. The electrical connector 20 has a second coefficient of thermal expansion. Together, the conductor 16 and the connector 20 form an electrical device 24. Preferably, the connector 20 includes titanium; however other metals, including, but not limited to, molybdenum, tungsten, hafnium, tantalum, chromium, iridium, niobium, vanadium, platinum, and combinations thereof may be suitable for the connector 20 so long as a difference between the first coefficient of thermal expansion of the substrate and the second coefficient of thermal expansion of the connector is less than or equal to $5 \times 10^{-6}/°$ C., which will be described in further detail below. The titanium enables the connector 20 to reduce mechanical stress between the connector 20 and the substrate 14 due to thermal expansion of the connector 20 and the substrate 14 resulting from changes in temperature. More specifically, the mechanical stress is caused by differences between the first and second coefficients of expansion. The mechanical stress may cause cracking or other damage to the substrate 14, and may also cause the connector 20 to separate from the substrate 14.

Preferably, the titanium is present in the connector 20 in an amount of at least 50 parts by weight based on the total weight of the connector 20. In a more preferred embodiment, the titanium is present in the connector 20 in an amount of at least 85 parts by weight, most preferably 99 parts by weight, based on the total weight of the connector 20. A composition comprising 99 parts by weight of titanium based on the total weight of the composition is considered commercially pure titanium. In the most preferred embodiment, a remainder of the connector 20 may include iron, oxygen, carbon, nitrogen, and/or hydrogen, each of which may be present in an amount of less than or equal to 0.2 parts by weight based on the total weight of the connector 20. Other residual elements may also be present in the connector 20 in an amount of less than 0.4 parts by weight based on the total weight of the connector 20.

In another embodiment, the titanium may be an alloyed titanium that is alloyed with a metal selected from the group of aluminum, tin, copper, molybdenum, cobalt, nickel, zirconium, vanadium, chromium, niobium, tantalum, palladium, ruthenium, and combinations thereof. In this other embodiment, the metal is preferably present in the connector 20 in a total amount of from 0.05 to 50 parts by weight, more preferably from 1 to 10 parts by weight, most preferably from 1 to 5 parts by weight, based on the total weight of the connector 20.

The connector 20 is free of lead to minimize environmental contamination caused by waste during manufacturing processes and processing of broken panes 10. The titanium is environmentally-friendly, i.e., titanium is less harmful to the environment than lead. Thus, waste tracking and disposal of excess titanium from the manufacturing process and the processing of broken panes 10 is less stringent than for lead.

Preferably, the alloyed titanium that is alloyed with the above-mentioned metals is further defined as one of an alpha alloy and an alpha-beta alloy. That is, the alloyed titanium is either an alpha alloy or an alpha-beta alloy in terms of a microstructure of the titanium alloy. Alpha alloys, along with the commercially pure titanium, exhibit excellent weldability. Thus, the alpha alloys and the commercially pure titanium may be welded onto the electrical conductor 16. Preferably, the alpha-beta alloys are weakly beta-stabilized. Weakly beta-stabilized alpha-beta alloys also exhibit excellent weldability. Strong beta-stabilized alpha-beta alloys may also be suitable. However, such alloys may be embrittled through welding. Furthermore, beta alloys may also be suitable for the subject invention; however, additional processing may be required to strengthen the alloy after welding.

The operative connection between the connector 20 and the conductor 16 is further defined as a metallurgical bond, as opposed to a chemical bond, between the connector 20 and the conductor 16. Metallurgical bonds are important to maintain electrical conductivity such that current can flow from a power supply 38, discussed in further detail below, to the electrical conductor 16. Those skilled in the art know that chemical bonds will increase a resistivity of the connection between the connector 20 and the conductor 16, and therefore inhibit the flow of current. The metallurgical bond may be formed through welding. Any welding process known in the art, such as laser welding, ultrasonic welding, friction welding, etc. may be used for welding the connector 20 to the conductor 16. Other techniques, such as thermocompression bonding, may also be used to form the metallurgical bond. In one embodiment, flux (not shown) may be disposed between the connector 20 and the conductor 16 to promote the formation of the metallurgical bond. However, in a most preferred embodiment, the connector 20 is directly bonded to the conductor 16 to form the metallurgical bond. The flux may be a thin-film metal flux, i.e., a flux including metal and having a thickness of less than or equal to $20 \times 10^{-6}$ m. Conventional braze flux may be used, which is generally a boron-based flux. The flux may also include tin, indium, and combinations thereof.

Figure 3:
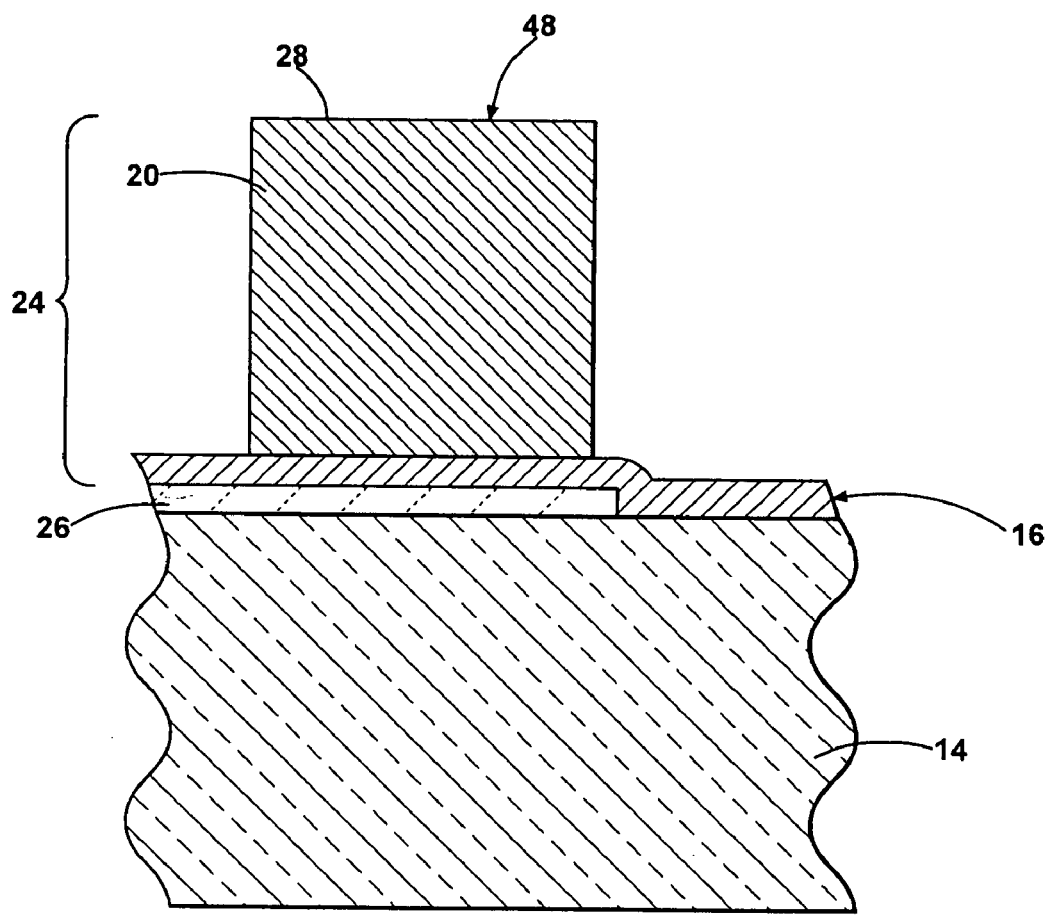
FIG. 3 is a schematic cross-sectional side view of the window pane taken along line 3—3 in FIG. 2a illustrating the electrical conductor operatively connected to a ceramic layer, which is operatively connected to a substrate.

Besides environmental considerations, another advantage of the presence of titanium in the connector 20 is that the titanium has a substantially similar coefficient of thermal expansion to the substrate 14, as briefly discussed above. Referring to FIG. 3, although the connector 20 and the substrate 14 are not directly connected, i.e., the conductor 16 is disposed between the substrate 14 and the connector 20, the substrate 14, which has the first coefficient of thermal expansion, is rigid and prone to cracking when subjected to mechanical stress. Preferably, the conductor 16 has a relatively small thickness of from $8 \times 10^{-6}$ to $12 \times 10^{-6}$ m, as compared to the connector 20, which preferably has a thickness of from $5 \times 10^{-4}$ to $1 \times 10^{-3}$ m. As a result of the small thickness and silver content of the conductor 16, the conductor 16 is malleable or deformable and deforms when subjected to mechanical stress resulting from expansion and contraction due to changes in temperature. Thus, the conductor 16, which has the second coefficient of thermal expansion, absorbs much of the mechanical stress due to changes in temperature. However, the connector 20 also expands and contracts due to the changes in temperature, which also results in mechanical stress that is absorbed by the conductor 16. As a result, substantial differences between the first and second coefficients of thermal expansion result in excessive mechanical stress on the conductor 16. The substrate 14 is generally more brittle than the connector 20 and cracks due to the mechanical stress.

A difference between the first and second coefficients of thermal expansion is equal to or less than $5 \times 10^{-6}/°$ C., taken as an average over the temperature range of from 0 to 300° C., which is sufficient to avoid cracking of the substrate 14 up to and including a temperature of 600° C. Preferably, the first coefficient of thermal expansion is from 8 to $9 \times 10^{-6}/°$ C. As mentioned above, the substrate is preferably soda-lime-silica glass, which has a coefficient of thermal expansion of from 8.3 to $9 \times 10^{-6}/°$ C., most preferably about $8.3 \times 10^{-6}/°$ C., also taken as an average over a temperature range of from 0 to 300° C. Preferably, the second coefficient of thermal expansion is from 3 to $13 \times 10^{-6}/°$ C., most preferably about $8.8 \times 10^{-6}/°$ C., taken as an average over the temperature range of from 0 to 300° C.

Besides silver, the conductor 16 may also include other materials such as glass frit and flow modifiers. The conductor 16 is applied to the substrate 14 as a paste, which is subsequently fired onto the substrate 14 through a sintering process. More specifically, after the paste is applied to the substrate 14, the substrate 14 is subjected to a low temperature bake at about 250° C., which causes the flow modifiers to flash out of the paste. The substrate 14 is then subjected to sintering at about 600° C., which fires the paste onto the substrate 14 to form the conductor 16. The sintering process also prevents mechanical stress from developing between the conductor 16 and the substrate 14.

When the conductor 16 is a defroster or defogger, the conductor 16 may further include vertical strips 50, 52, in addition to the lines 18, disposed on opposite ends of the lines 18. The strips 50, 52 electrically connect the lines 18. The strips 50, 52, in combination with the lines 18, form a parallel circuit.

Figure 4:
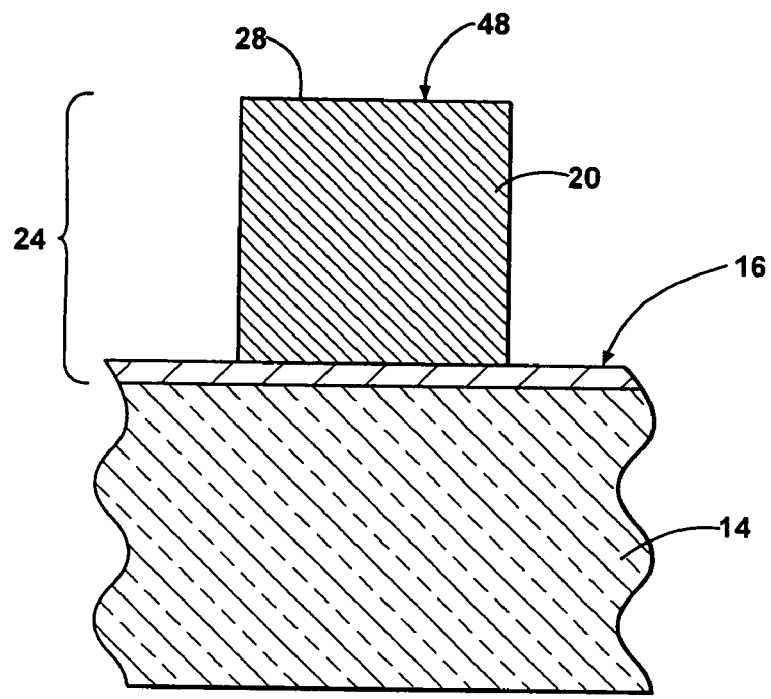
FIG. 4 is a schematic cross-sectional side view of another embodiment of the window pane illustrating the electrical conductor operatively connected to the substrate absent the ceramic layer.

Referring to FIG. 1, the pane 10 may include a ceramic layer 26 disposed adjacent to a periphery of the pane 10. The ceramic layer 26 protects an adhesive on the substrate 14 from UV degradation. As known in the art, such adhesive is typically utilized to adhere the pane 10 to a body of the vehicle 12. Thus, as shown in FIG. 3, the ceramic layer 26 may be disposed between the substrate 14 and the conductor 16. The ceramic layer 26 is generally black in color and has a negligible effect on the thermal expansion dynamics between the substrate 14, the conductor 16, and the connector 20. Thus, in terms of thermal expansion dynamics, there is no significant difference between the configuration as shown in FIG. 3, wherein the connector 20 is operatively connected to the conductor 16 on top of the ceramic layer 26, and the configuration as shown in FIG. 4, wherein the connector 20 is operatively connected to the conductor 16 on top of the substrate 14.

Figure 6:
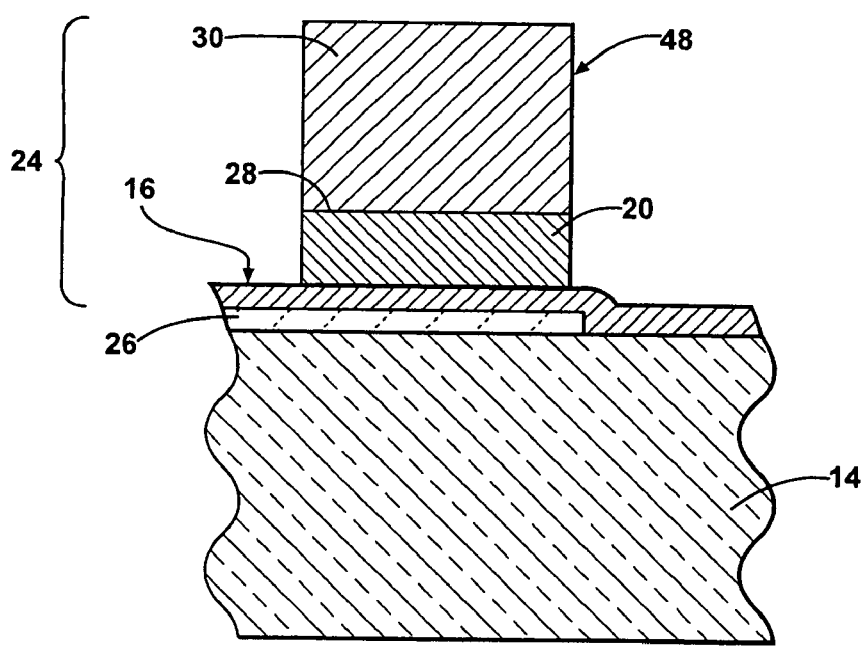
FIG. 6 is a schematic cross-sectional side view of the window pane taken along line 6—6 of FIG. 5.
Figure 5:
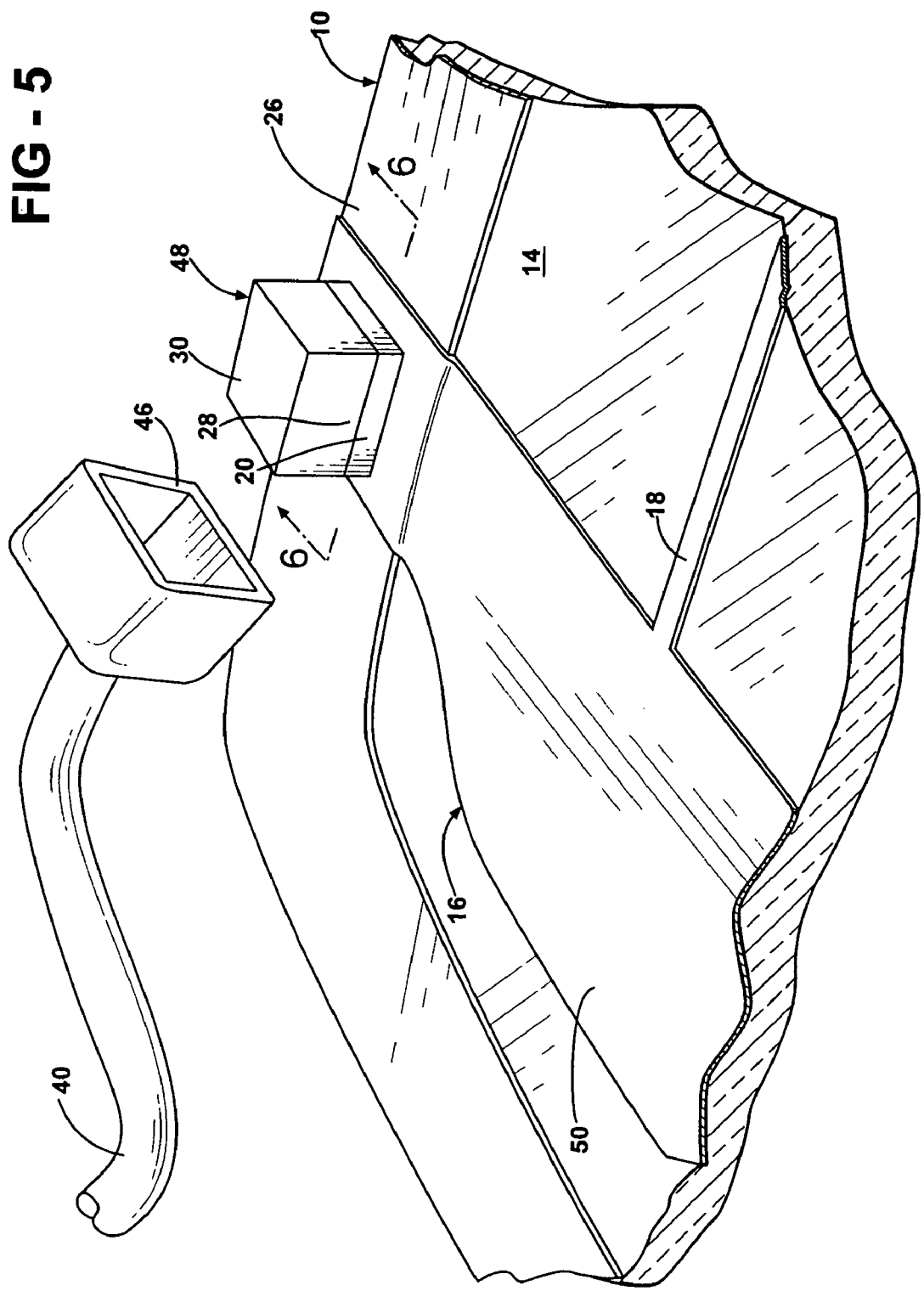
FIG. 5 is a partial cross-sectional perspective view of yet another embodiment of the window pane including a cladding clad to the electrical connector.

In one embodiment, shown in FIGS. 5 and 6, the connector 20 has an outer surface area 28 and a cladding 30 clad to the outer surface area 28. Preferably, the cladding 30 includes copper, which is more electrically conductive than the titanium, to improve flow of electricity through the connector 20. The cladding 30 is spaced from the conductor 16 such that the cladding 30 is mechanically insulated from the conductor 16 to avoid undue mechanical stress on the substrate 14 as discussed above, since the cladding 30 has a substantially different coefficient of thermal expansion from the substrate 14.

Preferably, the cladding 30 and the connector 20 are present relative to one another in a volumetric ratio of from 0.01:1 to 4:1 such that the connector 20 includes enough titanium to sufficiently minimize the mechanical stress caused by expansion and contraction of the cladding 30 due to the changes in temperature.

In another embodiment, the connector 20 may comprise the alloyed titanium that has 50 parts by weight or less of copper based on the total weight of the connector 20, with the balance comprising titanium, to eliminate the need for the cladding 30.

Figure 7:
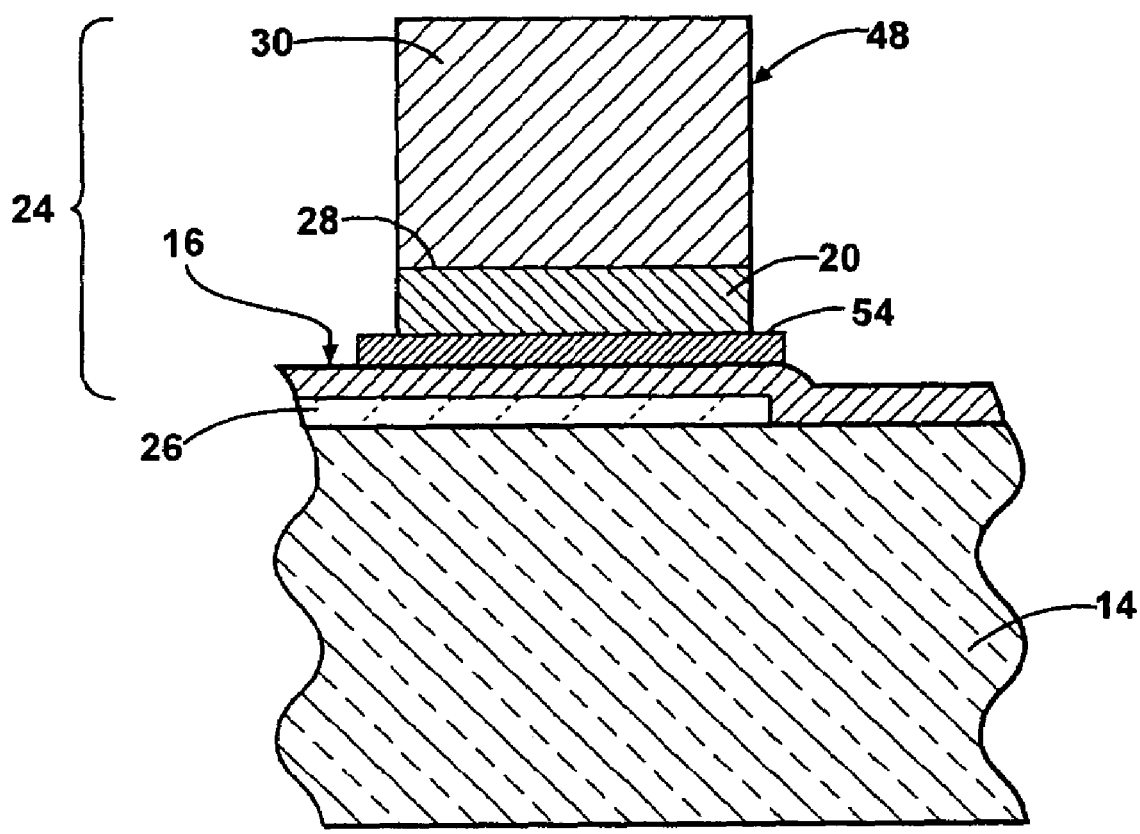
FIG. 7 is a schematic cross-sectional side view of another embodiment of the window pane taken along line 6—6 of FIG. 5.

As shown in FIG. 7, an electrically conductive foil 54 can be disposed between the connector 20 and the conductor 16 to bond the connector 20 to the conductor 16 for ensuring electrical communication between the connector 20 and the conductor 16. The foil 54 is particularly useful when the electrical connector 20 is formed of titanium. Preferably, the electrically conductive foil 54 is formed of aluminum.

The connector 20 transfers electrical energy to the conductor 16. Preferably, the connector 20 is connected to the conductor 16 adjacent the periphery of the pane 10 on one side of the pane 10. Preferably, a second connector 22 is operatively connected to and in electrical communication with the conductor 16 on an opposite side of the pane 10 from the connector 20. However, it is to be appreciated that only the connector 20 is required. The second connector 22 may transfer electrical energy away from the conductor 16. In one embodiment, as shown schematically in FIG. 2, the vehicle 12 includes the power supply 38 for providing the electrical energy. The power supply 38 may be a battery, alternator, etc. Preferably, both the connector 20 and the second connector 22 are operatively connected to and in electrical communication with the power supply 38. The connector 20 transfers electrical energy from the power supply 38 to the conductor 16, and the second connector 22 transfers electrical energy from the conductor 16 to the power supply 38. More specifically, a lead wire 40 is operatively connected to and extends from the power supply 38 adjacent to the substrate 14. The lead wire 40 is also operatively connected to the connector 20. Another wire 42 extends from the power supply 38 to the second connector 22 and is operatively connector 20 to the second connector 22 to complete an electrical circuit. The lead wire 40 and the wire 42 preferably include copper.

The operative connection between the lead wire 40 and the connector 20 may be formed through welding, a mechanical connection, etc. In one embodiment, a female member 46 extends from one of the connector 20 and the lead wire 40. A male member 48 extends from the other of the connector 20 and the lead wire 40 for operatively connecting to the female member 46. That is, as shown in FIG. 5, the female member 46 can extend from the lead wire 40 when the male member 48 extends from the connector 20, and vice versa. The operative connection between the second connector 22 and the second lead wire 42 may be the same as the operative connection between the connector 20 and the lead wire 40. In a most preferred embodiment, shown in FIG. 5, the lead wire 40 includes the female member 46 and the connector 20 includes the male member 48. The female member 46 engages the male member 48 through compression to prevent separation between the lead wire 40 and the connector 20. However, it is to be appreciated that the members 46, 48 may be connected through welding or other processes.

EXAMPLES

Plaques were made including the glass substrate 14, the electrical conductor 16, and the electrical connector 20. The electrical conductor 16 was formed from silver paste for all of the plaques, and the electrical connector 20 was formed from various materials. The glass substrate 14 was formed from soda-lime-silica glass. The plaques were subjected to an elevated temperature to determine which of the materials are suitable for the connector 20. More specifically, the plaques were first heated to a temperature of 250° C. for a period of about 20 minutes to remove residual components in the silver paste. The plaques were then heated to a temperature of about 620° C. for another period of about 20 minutes. The plaques were allowed to cool back down to room temperature of about 21° C. over a period of about 120 minutes. The plaques were observed for visual separation of the connector 20 from the glass substrate 14 and/or the conductor 16 and for visible cracking of the glass substrate 14, the absence of either of which indicates that the material is suitable for the connector 20. Referring to Table 1, the type and amount of material used for the connector 20 are shown for each of the plaques, with amounts in parts by weight based on the total weight of the connector 20, along with an indication of whether or not the material is suitable for the connector 20 or not. Furthermore, the properties of the soda-lime-silica glass are also included in the Table 1.

TABLE 1

| | Material | Ex. A | Ex. B | Comparative Ex. A | Comparative Ex. B |
|---|---|---|---|---|---|
| Electrical Connector | Titanium | 100.00 | 0.00 | 0.00 | 0.00 |
| | Copper | 0.00 | 0.00 | 100.00 | 0.00 |
| | Molybdenum | 0.00 | 100.00 | 0.00 | 0.00 |
| | Silver | 0.00 | 0.00 | 0.00 | 100.00 |
| | Resistivity at 20° C., µohm-*cm | 54.0 | 5.7 | 1.7 | 1.6 |
| | Avg. CTE, $\times 10^{-6}$/° C. over range of 0–100° C. | 8.80 | 5.1 | 17.00 | 19.1 |
| | Difference between CTE of Connector and Glass Substrate, $\times 10^{-6}$/° C. over a range of 0–100° C. | 0.5 | 3.2 | 8.7 | 10.8 |
| | Results of Elevated Temperature Test | No cracking, no separation (Suitable) | No cracking, no separation (Suitable) | Cracking and separation (Not Suitable) | Cracking and separation (Not Suitable) |
| Glass Substrate (Soda-Lime-Silica) | Resistivity at 20° C., uohm*cm | N/A | N/A | N/A | N/A |
| | Avg CTE, $\times 10^{-6}$/° C. over range of 0–302° C. | 8.3 | 8.3 | 8.3 | 8.3 |

Obviously, many modifications and variations of the present invention are possible in light of the above teachings. It is, therefore, to be understood that within the scope of the appended claims, the invention may be practiced otherwise than as specifically described.

What is claimed is:

1. A window pane comprising:
   a substrate formed from glass;
   an electrical conductor applied across a region of said substrate;
   an electrical connector operatively connected to and in electrical communication with said conductor for transferring electrical energy to said conductor; and
   said connector comprising titanium for minimizing mechanical stress between said connector and said substrate due to thermal expansion of said connector and said substrate resulting from changes in temperature.

2. A window pane as set forth in claim 1 wherein said connector is free of lead.

3. A window pane as set forth in claim 1 wherein said titanium is present in said connector in an amount of at least 50 parts by weight based on the total weight of said connector.

4. A window pane as set forth in claim 1 wherein said connector further comprises at least one of molybdenum, tungsten, hafnium, tantalum, chromium, iridium, niobium, platinum, and vanadium.

5. A window pane as set forth in claim 3 wherein said titanium is alloyed with a metal selected from the group of aluminum, tin, copper, molybdenum, cobalt, nickel, zirconium, vanadium, chromium, niobium, tantalum, palladium, ruthenium, and combinations thereof.

6. A window pane as set forth in claim 5 wherein said metal is present in an amount of from 0.05 to 50 parts by weight based on the total weight of said connector.

7. A window pane as set forth in claim 5 wherein said titanium alloyed with said metal is further defined as one of an alpha alloy and an alpha-beta alloy.

8. A window pane as set forth in claim 1 wherein said titanium is present in said connector in an amount of at least 85 parts by weight based on the total weight of said connector.

9. A window pane as set forth in claim 1 wherein said substrate has a first coefficient of thermal expansion and said connector has a second coefficient of expansion wherein a difference between said first and second coefficients of thermal expansion is equal to or less than $5 \times 10^{-6}$/° C.

10. A window pane as set forth in claim 9 wherein said second coefficient of thermal expansion is from 3 to $13 \times 10^{-6}/°$ C.

11. A window pane as set forth in claim 10 wherein said first coefficient of thermal expansion is from 8 to $9 \times 10^{-6}/°$ C.

12. A window pane as set forth in claim 1 further comprising an electrically conductive foil disposed between said connector and said conductor to bond said connector to said conductor for ensuring electrical communication between said connector and said conductor.

13. A window pane as set forth in claim 12 wherein said electrically conductive foil is formed of aluminum.

14. A window pane as set forth in claim 1 wherein said connector has an outer surface area and a cladding clad to said outer surface area and spaced from said conductor such that said cladding is mechanically insulated from said conductor.

15. A window pane as set forth in claim 14 wherein said cladding and said titanium are present in a volumetric ratio of from 0.01:1 to 4:1.

16. A window pane as set forth in claim 14 wherein said cladding comprises copper.

17. A window pane as set forth in claim 1 wherein said conductor comprises silver.

18. A window pane as set forth in claim 1 wherein said operative connection between said connector and said conductor is further defined as a metallurgical bond between said connector and said conductor.

19. A window pane as set forth in claim 1 further comprising flux disposed between said connector and said conductor.

20. A window pane as set forth in claim 1 further comprising a ceramic layer disposed between said substrate and said conductor.

21. A window pane as set forth in claim 1 wherein said glass is further defined as soda-lime-silica glass.

22. A window pane as set forth in claim 1 wherein said conductor is selected from the group of defoggers, defrosters, antennas, and combinations thereof.

* * * * *

UNITED STATES PATENT AND TRADEMARK OFFICE
CERTIFICATE OF CORRECTION

| | |
|---|---|
| PATENT NO. | : 7,223,939 B2 |
| APPLICATION NO. | : 10/988350 |
| DATED | : May 29, 2007 |
| INVENTOR(S) | : Timothy P. Hoepfner et al. |

Page 1 of 1

It is certified that error appears in the above-identified patent and that said Letters Patent is hereby corrected as shown below:

Title page, item (75) Inventors: After the word "Grand" delete "Lodge" and insert therein -- Ledge --.

Title page, item (73) Assignee: After the word "Americas", please delete the "," and please delete the space between "R" and "&" and, delete the space between "&" and "D".

Column 8, line 67, after the words "less than 5" insert therein a space between "5" and "x" and, insert a space between "x" and "10".

Column 9, line 2, after the words "is from 3 to" insert therein a space between "13" and "x" and, insert a space between "x" and "10".

Column 9, line 5, after the words "is from 8 to" insert therein a space between "9" and "x" and, insert a space between "x" and "10".

Signed and Sealed this

Thirty-first Day of July, 2007

JON W. DUDAS
*Director of the United States Patent and Trademark Office*